United States Patent

Hoffman et al.

[11] Patent Number: 6,063,356
[45] Date of Patent: May 16, 2000

[54] ON-SITE MANUFACTURE OF ULTRA-HIGH-PURITY HYDROFLUORIC ACID FOR SEMICONDUCTOR PROCESSING

[75] Inventors: Joe G. Hoffman, Cardiff; R. Scot Clark, Fallbrook, both of Calif.

[73] Assignee: Air Liquide America Corporation, Houston, Tex.

[21] Appl. No.: 09/034,004

[22] Filed: Mar. 3, 1998

Related U.S. Application Data

[60] Division of application No. 08/673,909, Jul. 1, 1996, Pat. No. 5,785,820, which is a continuation-in-part of application No. PCT/US96/09554, Jun. 5, 1996, which is a continuation-in-part of application No. PCT/US95/07649, Jun. 5, 1996, which is a continuation-in-part of application No. 08/610,261, Mar. 4, 1996, Pat. No. 5,755,934, which is a continuation of application No. 08/179,001, Jan. 7, 1994, Pat. No. 5,496,778.

[60] Provisional application No. 60/038,711, Jul. 7, 1995.

[51] Int. Cl.[7] ...................................................... C01B 7/19

[52] U.S. Cl. ........................................... 423/483; 423/488

[58] Field of Search ................................. 423/483, 488, 423/484

[56] References Cited

U.S. PATENT DOCUMENTS

| | | | |
|---|---|---|---|
| 3,725,536 | 4/1973 | Gentili | 423/485 |
| 4,150,102 | 4/1979 | Schabacher et al. | 423/485 |
| 4,832,935 | 5/1989 | Lester et al. | 423/483 |
| 5,318,706 | 6/1994 | Ohmi et al. | 210/649 |
| 5,437,848 | 8/1995 | Hard | 423/7 |
| 5,632,866 | 5/1997 | Grant | 203/12 |

FOREIGN PATENT DOCUMENTS

| | | |
|---|---|---|
| 62-213127 | 9/1987 | Japan . |
| 62-253772 | 11/1987 | Japan . |
| 62-264280 | 11/1987 | Japan . |
| 63-152603 | 6/1988 | Japan . |
| 63-283027 | 11/1988 | Japan . |
| 64-34407 | 2/1989 | Japan . |

*Primary Examiner*—Ngoc-Yen Nguyen
*Attorney, Agent, or Firm*—Burns, Doane, Swecker & Mathis, L.L.P.

[57] ABSTRACT

A system for purification and generation of hydrofluoric acid on-site at a semiconductor device fabrication facility. An evaporation stage (optionally with arsenic oxidation) is followed by a fractionating column to remove most other impurities, an Ionic Purifier column to suppress contaminants not removed by the fractionating column, and finally the HF Supplier (HFS).

11 Claims, 3 Drawing Sheets

ON-SITE MANUFACTURE OF ULTRA-HIGH-PURITY HYDROFLUORIC ACID FOR SEMICONDUCTOR PROCESSING

This application is a divisional of application Ser. No. 08/673,909, filed Jul. 1, 1996, now U.S. Pat. No. 5,785,820, which a continuation-in-part of application Ser. No. 08/610, 261, filed Mar. 4, 1996, now U.S. Pat. No. 5,755,934, which is a continuation of application Ser. No. 08/179,001, filed Jan. 7, 1994, now U.S. Pat. No. 5,496,778. The application Ser. No. 08/673,909 is also a continuation-in-part of PCT application Nos. PCT/US96/09554, filed Jun. 5, 1996, and PCT/US95/07649, filed Jun. 5, 1995. The present application also claims benefit of priority through application Ser. No. 08/673,909 of U.S. provisional Application Ser. No. 60/038,711, filed Jul 7, 1995.

BACKGROUND AND SUMMARY OF THE INVENTION

The present invention relates to semiconductor manufacture, and particularly to systems and methods for supplying ultra-high-purity HF and hydrofluoric acid for semiconductor manufacture.

Background: Contamination in IC Manufacturing

Contamination is generally an overwhelmingly important concern in integrated circuit manufacturing. A large fraction of the steps in modern integrated circuit manufacturing are cleanup steps of one kind or another; such cleanup steps may need to remove organic contaminants, metallic contaminants, photoresist (or inorganic residues thereof), byproducts of etching, native oxides, etc.

As of 1995 the cost of a new front end (integrated circuit wafer fabrication facility) is typically more than a billion dollars ($1,000,000,000), and a large fraction of this cost is directed to measures for particulate control, cleanup, and contamination control.

One important source of contamnination is impurities in the process chemicals. Since the cleanups are so frequent and so critical, contamination due to cleanup chemistry is very undesirable.

The extreme purity levels required by semiconductor manufacturing are rare or unique among industrial processes. At such extreme purity levels, handling of chemicals is inherently undesirable (though of course it cannot be entirely avoided). Exposure of the ultrapure chemical to air (particularly in an environment where workers are also present) must be minimized. Such exposure risks introduction of particulates, and resulting contamination. Shipment of ultrapure chemicals in closed containers is still not ideal, since there is inherently a higher risk of contaminants at the manufacturer or at the user's site. Moreover, undetected contamination may damage an expensively large quantity of wafers.

Since many corrosive and/or toxic chemicals are commonly used in semiconductor processing, the reagent supply locations are commonly separated from the locations where front-end workers are present. Construction and maintenance of piping for ultra-high-purity gasses and liquids are well-understood in the semiconductor industry, so most gasses and liquids can be transported to wafer fabrication stations from anywhere in the same building (or even in the same site).

Wet Versus Dry Processing

One of the long-running technological shifts in semiconductor processing has been the changes (and attempted changes) between dry and wet processing. In dry processing, only gaseous or plasma-phase reactants come in contact with the wafer. In wet processing, a variety of liquid reagents are used for purposes such as etching silicon dioxide or removing native oxide layers, removing organic materials or trace organic contaminants, removing metals or trace organic contaminants, etching silicon nitride, etching silicon.

Plasma etching has many attractive capabilities, but it is not adequate for cleanup. There is simply no available chemistry to remove some of the most undesirable impurities, such as gold. Thus wet cleanup processes are essential to modern semiconductor processing, and are likely to remain so for the foreseeable future.

Plasma etching is performed with photoresist in place, and is not directly followed by high-temperature steps. Instead the resist is stripped, and a cleanup is then necessary.

The materials which the cleanup must remove may include: photoresist residues (organic polymers); sodium; Alkaline earths (e.g. calcium or magnesium); and heavy metals (e.g. gold). Many of these do not form volatile halides, so plasma etching cannot carry them away. Cleanups using wet chemistries are required.

The result of this is that purity of process chemicals at plasma etching is not as critical, since these steps are always followed by cleanup steps before high-temperature steps occur, and the cleanup steps can remove dangerous contaminants from the surface before high-temperature steps drive in these contaminants. However, purity of the liquid chemicals is much more critical, because the impingement rate at the semiconductor surface is typically a million times higher than in plasma etching, and because the liquid cleanup steps are directly followed by high-temperature steps.

However, wet processing has one major drawback, namely ionic contamination. Integrated circuit structures use only a few dopant species (boron, arsenic, phosphorus, and sometimes antimony) to form the required p-type and n-type doped regions. However, many other species are electrically active dopants, and are highly undesirable contaminants. Many of these contaminants can have deleterious effects, such as increased junction leakage, at concentrations well below $10^{13} cm^{-3}$. Moreover, some of the less desirable contaminants segregate into silicon, i.e. where silicon is in contact with an aqueous solution the equilibrium concentration of the contaminants will be higher in the silicon than in the solution. Moreover, some of the less desirable contaminants have very high diffusion coefficients, so that introduction of such dopants into any part of the silicon wafer will tend to allow these contaminants to diffuse throughout, including junction locations where these contaminants will cause leakage.

Thus all liquid solutions which will be used on a semiconductor wafer should preferably have extremely low levels of all metal ions. Preferably the concentration of all metals combined should be less than 300 ppt (parts per trillion), and less than 10 ppt for any one metal, and less would be better. Moreover, contamination by both anions and cations must also be controlled. (Some anions may have adverse effects, e.g. complexed metal ions may reduce to mobile metal atoms or ions in the silicon lattice.)

Front end facilities normally include on-site purification systems for preparation of high-purity water (referred to as "DI" water, i.e. deionized water). However, it is more difficult to obtain process chemicals in the purities needed.

Ammonia Purification

The present inventors have developed a method for preparing ultra-high-purity ammonia, in an on-site system located at the semiconductor wafer production site, by: drawing ammonia vapor from a liquid ammonia reservoir, passing the ammonia vapor through a microfiltration filter, and scrubbing the filtered vapor with high-pH purified water (preferably deionized water which has been allowed to equilibrate with the ammonia stream). This discovery permitted conversion of commercial grade ammonia to ammonia of sufficiently high purity for high precision manufacturing without the need for conventional column distillation. The drawing of the ammonia vapor from the supply reservoir serves by itself as a single-stage distillation, eliminating nonvolatile and high-boiling impurities, such as alkali and alkaline earth metal oxides, carbonates and hydrides, transition metal halides and hydrides, and high-boiling hydrocarbons and halocarbons. The reactive volatile impurities that could be found in commercial grade ammonia, such as certain transition metal halides, Group III metal hydrides and halides, certain Group IV hydrides and halides, and halogens, previously thought to require distillation for removal, were discovered to be capable of removal by scrubbing to a degree which is adequate for high-precision operations. This is a very surprising discovery, since scrubber technology is traditionally used for the removal of macro-scale, rather than micro-scale, impurities.

Innovative Systems and Methods for Semiconductor Manufacturing with On-Site HF Purification The present application discloses systems and methods for preparation of ultrapure chemicals on-site at a semiconductor manufacturing facility, so that they can be piped directly to the points of use. The disclosed systems are very compact units which can be located in the same building as a front end (or in an adjacent building), so that handling is avoided.

Hydrofluoric acid (HF) is an important process chemical in semiconductor manufacturing. It is overwhelmingly important for deglaze (i.e. removal of thin native oxides) and for oxide removal generally. It is also a component of standard wet etches for isotropic etching of silicon (e.g. "CP4A," which is 3 parts HF, 5 parts $HNO_3$, and 3 parts acetic acid).

As noted above, the present inventors have discovered methods and systems for preparing ultra-high-purity ammonia It has now been discovered that a modification of these methods and systems can be used to prepare ultra-high-purity hydrofluoric acid.

Anhydrous HF is typically manufactured by the addition of sulfuric acid to fluorspar, $CaF_2$. Unfortunately, many fluorspars contain arsenic, which leads to contamination of the resulting HF. Thus arsenic contamination is a dominant problem with HF purification. One source (from China) contains minimal As and is the optimal raw material for Ultra high purity HF. Low-arsenic HF, manufactured from this material and then further purified, is available from Allied Chemical in the U.S. Other impurities, in conventional systems, are contributed by the HF generation and handling system. These impurities result from degradation of these systems; these systems were designed for applications much less demanding than the semiconductor industry. These contaminants must be removed in order to achieve good semiconductor performance.

HF Vaporization

The starting material is preferably low-arsenic HF. Such acid is commercially available from Allied Chemical (manufactured in Geismar Louisiana). Such material, as used in the presently preferred embodiment, has an incoming arsenic concentration specified at <1 ppb.

Optionally, however, a batch process arsenic removal and evaporation stage may be included to reduce the arsenic concentration before the Ionic Purifier column. The Ionic Purifier column is followed by the HF Supplier (HFS). In this optional embodiment, arsenic will be converted to the +5 state and held in the evaporator during distillation by the addition of an oxidant ($KMnO_4$ or $(NH_4)_2S_2O_8$) and a cation source such as $KHF_2$ to form the salt $K_2AsF_7$. This will be a batch process as this reaction is slow and sufficient time for completion must be allowed before the distillation takes place. This process requires contact times of approximately 1 hr at nominal temperatures. In this process the HF would be introduced into a batch process evaporator vessel and would be treated with an oxidant while stirring for a suitable reaction time.

The low-arsenic HF is then distilled in a fractionating column with reflux thus removing the bulk of the metallic impurities. Elements showing significant reduction at this step include:

| Group 1 (I) | Na, |
|---|---|
| Group 2 (II) | Ca, Sr, Ba, |
| Groups 3–12 (IIIA–IIA) | Cr, W, Mo, Mn, Fe, Cu, Zn |
| Group 13 (III) | Ga, |
| Group 14 (IV) | Sn, Pb, and |
| Group 15 (VII) | Sb. |

This fractionating column acts as a series of many simple distillations; this is achieved by packing the column with a high surface area material with a counter current liquid flow thus ensuring complete equilibrium between the descending liquid and rising vapor. Only a partial condenser will be installed in this column to provide reflux and the purified gaseous HF will then be conducted to the HF Ionic Purifier (HF IP). The HF at this stage is pure by normal standards.

The HF IP will be utilized as an additional purity guarantee prior to introduction of the HF gas into the supplier systems. These elements may be present in the treatment solution or introduced in the IP to absorb sulfate carried over in the HF stream. IP testing has demonstrated significant reductions in the HF gas stream contamination for the following elements:

| Group 2 (II) | Sr, and Ba, |
|---|---|
| Groups 6–12 (VIA–IIA) | Cr, W, and Cu, |
| Group 13(III) | B, |
| Group 14(IV) | Pb, Sn, and |
| Group 15 (V) | Sb. |

Many of these elements are usefull in addressing the As contamination suppression. Any carry over in the distillation column arising from their excess in the As treatment can be rectified at this step.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment (by way of example, and not of limitation), in which:

HF Purification On-Site

Figure 1:
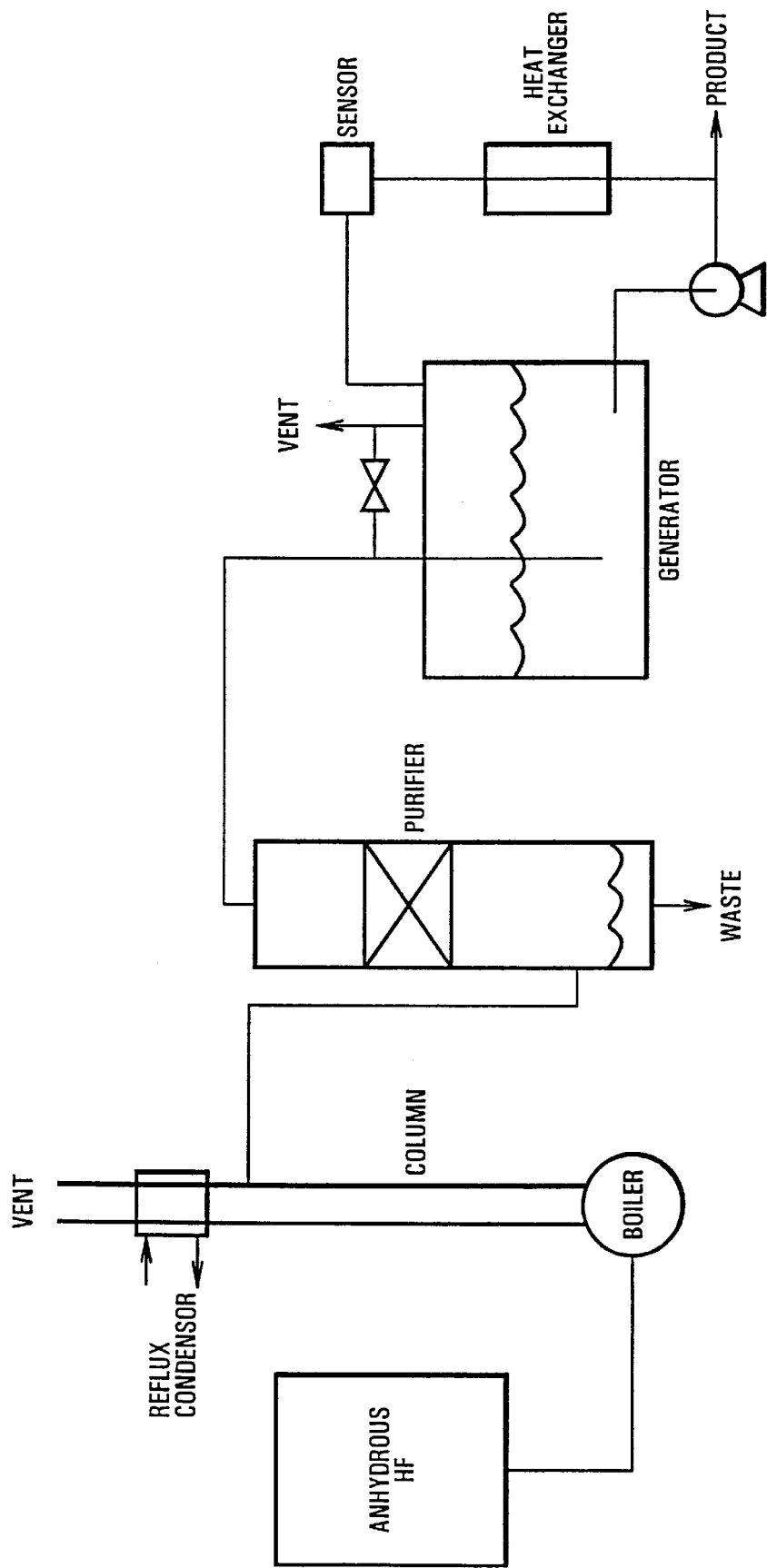
FIG. 1 shows an on-site HF purifier according to a sample embodiment of the disclosed innovations.
Figure 1A:
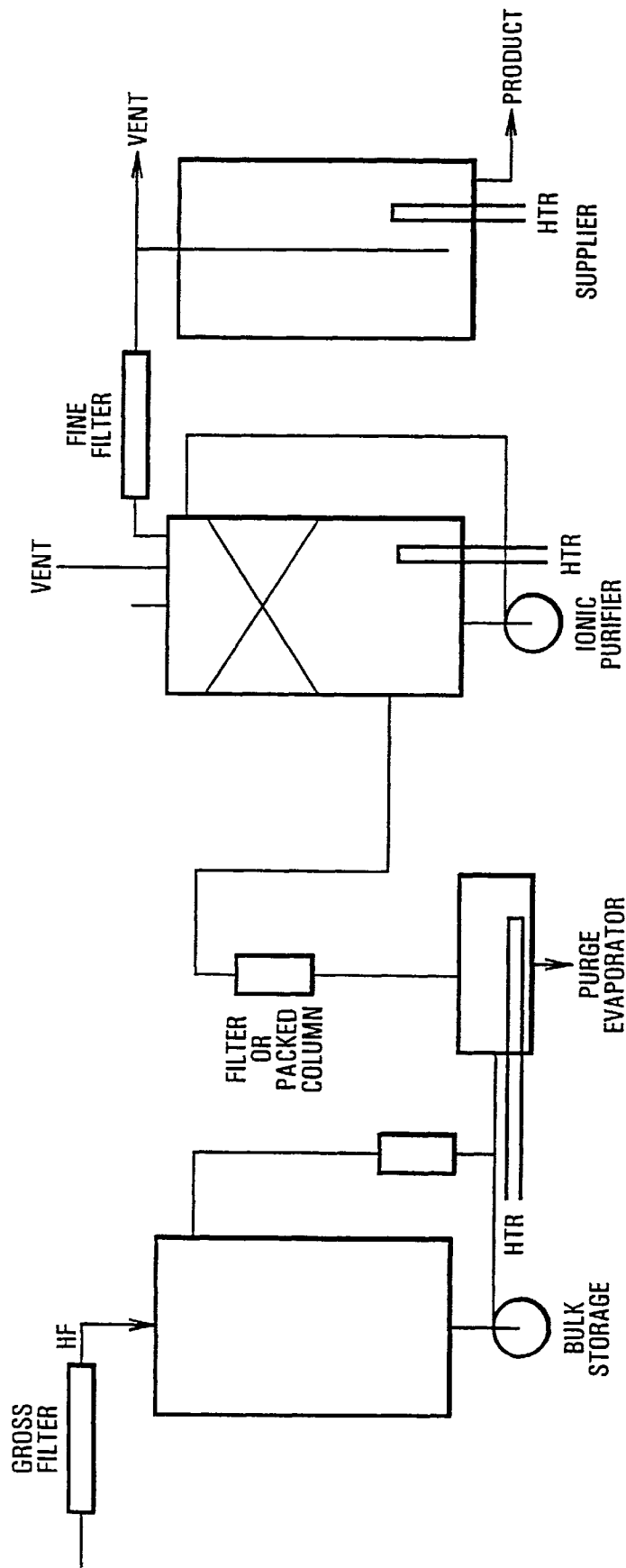
FIG. 1A shows an on-site HF purifier according to an alternative embodiment of the disclosed innovations, wherein high-purity arsenic-reduced hydrofluoric acid is used as the bulk starting material.

FIG. 1A shows an on-site HF purifier according to an alternative embodiment of the disclosed innovations, wherein high-purity arsenic-reduced hydrofluoric acid is used as the bulk starting material.

The starting material is preferably ultrapure 49% HF which is essentially arsenic-free (arsenic concentration below 1 ppb). As noted above, such low-arsenic material is commercially available from Allied, and can used, in combination with an on-site ionic purification process which does NOT include an arsenic oxidation reagent, to produce ultrapure HF on-site.

The HF process flow includes an evaporation stage, a fractionating column to remove most other impurities, an Ionic Purifier column to suppress contaminants not removed by the fractionating column, and finally the HF Supplier (HFS).

The HF is then distilled in a fractionating column with reflux thus removing the bulk of the metallic impurities. Elements showing significant reduction at this step include:

| | |
|---|---|
| Group 1 (I) | Na, |
| Group 2 (II) | Ca, Sr, Ba, |
| Groups 3–12 (IIIA–IIA) | Cr, W, Mo, Mn, Fe, Cu, Zn |
| Group 13 (III) | Ga, |
| Group 14 (IV) | Sn, Pb, and |
| Group 15 (VII) | Sb. |

This fractionating column acts as a series of many simple distillations; this is achieved by packing the column with a high surface area material with a counter current liquid flow thus ensuring complete equilibrium between the descending liquid and rising vapor. Only a partial condenser will be installed in this column to provide reflux and the purified gaseous HF will then be conducted to the HF Ionic Purifier (HF IP). The HF at this stage is pure by normal standards, except for the possible carry over of the arsenic treatment chemicals or the quench required to remove these chemicals.

The HF IP will be utilized as an additional purity guarantee prior to introduction of the HF gas into the supplier systems. These elements may be present in the treatment solution or introduced in the IP to absorb sulfate carried over in the HF stream. IP testing has demonstrated significant reductions in the HF gas stream contamination for the following elements:

| | |
|---|---|
| Group 2 (II) | Sr, and Ba, |
| Groups 6–12 (VIA–IIA) | Cr, W, and Cu, |
| Group 13(III) | B, |
| Group 14(IV) | Pb, Sn, and |
| Group 15 (V) | Sb. |

Many of these elements are useful in addressing the As contamination suppression. Any carry over in the distillation column arising from their excess in the As treatment can be rectified at this step.

FIG. 1 shows an on-site HF purifier according to an alternative embodiment of the disclosed innovations. In this alternative and less preferred embodiment, an initial batch HF purification is accomplished by first oxidizing arsenic into the +5 oxidation state and fractionation to remove the $As^{+5}$ and metallic impurities. See U.S. Pat. No. 4,929,435, which is hereby incorporated by reference. A variety of oxidizing reagents have been used for this purpose, as shown in the literature. Fluorine ($F_2$) has been shown to work (by the published work of others), and is regarded as the presently preferred implementation of this alternative embodiment. $F_2$ requires expensive plumbing and safeguards, but has been shown to be workable. An alternative embodiment uses ammonium persulfate (($NH_4$)$_2S_2O_8$), which is conveniently available in ultra-high purity. In general, oxidizers which do not introduce metal atoms are preferred; thus other candidates include $H_2O_2$ and $O_3$. A less preferred candidate is Caro's acid (persulfuric acid, $H_2SO_5$, which produces $H_2O_2$ in solution). Another option is $ClO_2$, but this has the severe disadvantage of being explosive. Other options include $HNO_3$ and $Cl_2$, but both of these introduce anions which must be separated out. (Reduction of non-metallic anions is not as critical as reduction of metal cations, but it is still desirable to achieve anion levels of 1 ppb or less. Initial introduction of anions thus adds to the load on the ionic purification stage.) $KMnO_4$ is the most conventional oxidant, and is predicted to be useable for ultrapurification if followed by the disclosed ionic purifier and HF stripping process. However, this reagent imposes a substantial burden of cations on the purifier, so a metal-free oxidizer is preferred.

Wafer Cleaning

Figure 2:
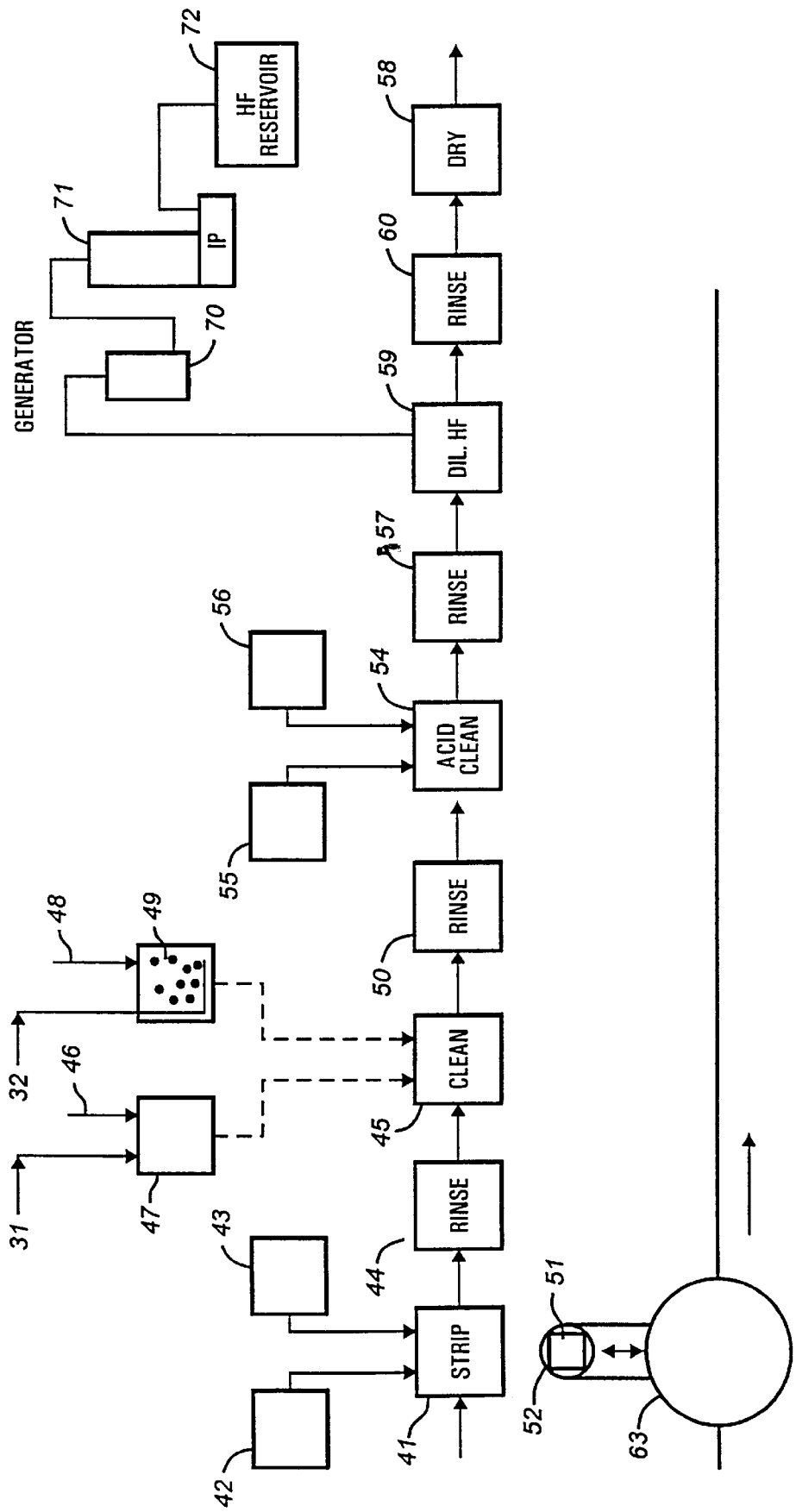
FIG. 2 is a block diagram of a semiconductor fabrication line to which the purification unit of FIG. 1 may be directly connected.

Some cleanup stations in a conventional line for semiconductor fabrication are depicted in FIG. 2. The first unit in the cleaning line is a resist stripping station 41 where aqueous hydrogen peroxide 42 and sulfuric acid 43 are combined and applied to the semiconductor surface to strip off the resist. This is succeeded by a rinse station 44 where deionized water is applied to rinse off the stripping solution. Immediately downstream of the rinse station 44 is a cleaning station 45 where an aqueous solution of ammonia and hydrogen peroxide are applied. This solution is supplied in one of two ways. In the first, aqueous ammonia 31 is combined with aqueous hydrogen peroxide 46, and the resulting mixture 47 is directed to the cleaning station 45. In the second, pure gaseous ammonia 32 is bubbled into an aqueous hydrogen peroxide solution 48 to produce a similar mixture 49, which is likewise directed to the cleaning station 45. Once cleaned with the ammonia/hydrogen peroxide combination, the semiconductor passes to a second rinse station 50 where deionized water is applied to remove the cleaning solution. The next station is a further cleaning station 54 where aqueous solutions of hydrochloric acid 55 and hydrogen peroxide 56 are combined and applied to the semiconductor surface for further cleaning. This is followed by a final rinse station 57 where deionized water is applied to remove the HCl and $H_2O_2$. At deglaze station 59 dilute buffered HF is applied to the wafer (for removal of native or other oxide film). The dilute buffered hydrofluoric acid is supplied directly, through sealed piping, from the generator 70. As described above, the reservoir 72 holds anhydrous HF, from which a stream of gaseous HF is fed through the ionic purifier 71 into generator 70. Preferably gaseous ammonia is also bubbled into generator 70 to provide a buffered solution, and ultrapure deionized water is added to achieve the desired dilution. This is followed by a rinse in ultrapure deionized water (at station 60), and drying at station 58. The wafer or wafer batch 61 will be held on a wafer support 52, and conveyed from one workstation to the next by a robot 63 or some other conventional means of achieving sequential treatment. The means of conveyance may be totally automated, partially automated or not automated at all.

The system shown in FIG. 2 is just one example of a cleaning line for semiconductor fabrication. In general, cleaning lines for high-precision manufacture can vary widely from that shown in FIG. 2, either eliminating one or more of the units shown or adding or substituting units not shown. The concept of the on-site preparation of high-purity aqueous ammonia, however, in accordance with this invention is applicable to all such systems.

The use of ammonia and hydrogen peroxide as a semiconductor cleaning medium at workstations such as the cleaning station 45 shown in FIG. 2 is well known throughout the industry. While the proportions vary, a nominal system would consist of deionized water, 29% ammonium hydroxide (weight basis) and 30% hydrogen peroxide (weight basis), combined in a volume ratio of 6:1:1. This cleaning agent is used to remove organic residues, and, in conjunction with ultrasonic agitation at frequencies of approximately 1 MHz, removes particles down to the submicron size range.

In one class of embodiments, the purification (or purification and generation) system is positioned in close proximity to the point of use of the ultrapure chemical in the production line, leaving only a short distance of travel between the purification unit and the production line. Alternatively, for plants with multiple points of use, the ultrapure chemical from the purification (or purification and generation) unit may pass through an intermediate holding tank before reaching the points of use. Each point of use will then be fed by an individual outlet line from the holding tank. In either case, the ultrapure chemical can therefore be directly applied to the semiconductor substrate without packaging or transport and without storage other than a small in-line reservoir, and thus without contact with the potential sources of contamination normally encountered when chemicals are manufactured and prepared for use at locations external to the manufacturing facility. In this class of embodiments, the distance between the point at which the ultrapure chemical leaves the purification system and its point of use on the production line will generally be a few meters or less. This distance will be greater when the purification system is a central plant-wide system for piping to two or more use stations, in which case the distance may be two thousand feet or greater. Transfer can be achieved through an ultra-clean transfer line of a material which does not introduce contamination. In most applications, stainless steel or polymers such as high density polyethylene or fluorinated polymers can be used successfully.

Due to the proximity of the purification unit to the production line, the water used in the unit can be purified in accordance with semiconductor manufacturing standards. These standards are commonly used in the semiconductor industry and well known among those skilled in the art and experienced in the industry practices and standards. Methods of purifying water in accordance with these standards include ion exchange and reverse osmosis. Ion exchange methods typically include most or all of the following units: chemical treatment such as chlorination to kill organisms; sand filtration for particle removal; activated charcoal filtration to remove chlorine and traces of organic matter: diatomaceous earth filtration; anion exchange to remove strongly ionized acids; mixed bed polishing, containing both cation and anion exchange resins to remove further ions; sterilization, involving chlorination or ultraviolet light; and filtration through a filter of 0.45 micron or less. Reverse osmosis methods will involve, in place of one or more of the units in the ion exchange process, the passage of the water under pressure through a selectively permeable membrane which does not pass many of the dissolved or suspended substances. Typical standards for the purity of the water resulting from these processes are a resistivity of at least about 15 megohm-cm at 25° C. (typically 18 megohm-cm at 25° C.), less than about 25 ppb of electrolytes, a particulate content of less than about 150/cm$^3$ and a particle size of less than 0.2 micron, a microorganism content of less than about 10/cm$^3$, and total organic carbon of less than 100 ppb.

In the process and system of this invention, a high degree of control over the product concentration and hence the flow rates is achieved by precise monitoring and metering using known equipment and instrumentation. A convenient means of achieving this is by acoustic velocity sensing. Other methods will be readily apparent to those skilled in the art. Various modifications of the concentration control loop (using conductivity, etc., in place of acoustic velocity) can be implemented if desired.

According to a disclosed class of innovative embodiments, there is provided: An on-site subsystem, in a semiconductor device fabrication facility, for providing ultra-high-purity reagents comprising HF to a semiconductor manufacturing operation, comprising: an evaporation source connected to receive an HF source and to provide a flow of HF vapor therefrom; said flow of HF vapor being connected to pass through an ionic purifier unit which provides a recirculating volume of high-purity water, containing a high concentration of HF in contact with said flow of HF vapor, wherein said purifier exhausts a small amount of HF gas; and a generator unit, connected to receive said flow of HF vapor from said purifier and to combine said HF vapor with an aqueous liquid to produce an ultra-pure aqueous solution comprising hydrofluoric acid; and a piping connection which routes said aqueous solution to points of use in the semiconductor device fabrication facility.

According to another disclosed class of innovative embodiments, there is provided: An on-site subsystem, in a semiconductor device fabrication facility, for providing ultra-high-purity reagents comprising HF to a semiconductor manufacturing operation, comprising: an evaporation source connected to receive HF and to provide a flow of HF vapor therefrom; said flow of HF vapor being connected to pass through an ionic purifier unit which provides a recirculating volume of high-purity water, containing a high concentration of HF in contact with said flow of HF vapor, wherein said purifier exhausts a small amount of HF gas; and a generator unit, connected to receive said flow of HF vapor from said purifier and to combine said HF vapor with an aqueous liquid to produce an ultra-pure aqueous solution comprising hydrofluoric acid; whereby said ultra-pure aqueous solution can be used within the semiconductor device fabrication facility without bulk transfer or exposure of liquid surface to any uncontrolled ambient atmosphere.

According to another disclosed class of innovative embodiments, there is provided: An on-site subsystem, in a semiconductor device fabrication facility, for providing ultra-high-purity HF for use in semiconductor manufacturing operations at said facility, comprising: an evaporation source connected to receive a liquid HF source and to provide a flow of HF vapor therefrom; said flow of HF vapor being connected to pass through an ionic purifier unit which provides a recirculating volume of high-purity water, containing a high concentration of HF in contact with said flow of HF vapor, wherein said purifier exhausts a small amount of HF gas; and a dryer unit, connected to receive said flow of HF vapor from said purifier and to dry said HF vapor; and a piping connection which routes said vapor from said dryer to points of use in the semiconductor device fabrication facility.

According to another disclosed class of innovative embodiments, there is provided: A method for supplying a high-purity HF reagent to a workstation in a production line for the manufacture of a high-precision electronic component, said method comprising: (a) drawing HF gas from a vapor space above hydrofluoric acid in an HF-containing reservoir; (b) passing said HF gas through a filtration membrane removing particles greater than 0.005 micron therefrom; (c) passing said HF gas thus filtered through a scrubber whereby said HF gas is contacted with an aqueous solution of HF in deionized water, wherein said scrubber exhausts a small amount of HF gas; and (d) recovering HF gas emerging from said scrubber and directing said HF gas to said workstation.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, the source of gaseous HF for purification can be anhydrous HF, or alternatively can be a heated evaporator which evolves HF from 49% aqueous HF)

For example, the disclosed innovative techniques are not strictly limited to manufacture of integrated circuits, but can also be applied to manufacturing discrete semiconductor components, such as optoelectronic and power devices.

For another example, the disclosed innovative techniques can also be adapted to manufacture of other technologies where integrated circuit manufacturing methods have been adopted, such as in thin-film magnetic heads and active-matrix liquid-crystal displays; but the primary application is in integrated circuit manufacturing, and applications of the disclosed techniques to other areas are secondary.

For another example, it is not strictly necessary to use a scrubber to perform the liquid-vapor contact; a bubbler could be used instead, although this is much less desirable because of the less efficient gas/liquid contact.

Optionally other filtration or filtration stages can be combined with the disclosed purification apparatus.

It should also be noted that additives can be introduced into the purification water if desired, although this is not done in the presently preferred embodiment.

As noted above, the primary embodiment is an on-site purification system. Alternatively, in a less preferred class of embodiment, the disclosed purification system can also be adapted to operate as a part of a manufacturing unit to produce ultra-high-purity chemicals for shipment; however, this alternative embodiment does not provide the advantages of on-site purification as discussed above. Such applications encounter the inherent risks of handling ultra-high-purity chemicals, as discussed above; but for customers who require packaged chemicals (with the attendant handling), the disclosed innovations at least give a way to achieve an initial purity which is higher than that available by other techniques. Again, in such applications a dryer stage may also be used after the ionic purifier.

As noted above, the primary embodiment is directed to providing ultrapure aqueous chemicals, which are most critical for semiconductor manufacturing. However, the disclosed system and method embodiments can also be used for supply of purified gas streams. (In many cases, use of a dryer downstream from the purifier will be useful for this.)

It should also be noted that piping for ultrapure chemical routing in semiconductor front ends may include in-line or pressure reservoirs. Thus references to "direct" piping in the claims do not preclude use of such reservoirs, but do preclude exposure to uncontrolled atmospheres.

What is claimed is:

1. A method for purifying hydrogen fluoride, for use in the manufacture of an electronic component, comprising the steps of:

(a) providing a flow of hydrogen fluoride vapor comprising a low concentration of arsenic; and (b) introducing said flow of hydrogen fluoride vapor comprising a low concentration of arsenic into an ionic purifier which provides a recirculating volume of high-purity water containing a high concentration of hydrogen fluoride, wherein said recirculating volume of high-purity water is in contact with said flow of hydrogen fluoride vapor, and wherein a flow of purified hydrogen fluoride vapor flows from said ionic purifier.

2. The method according to claim 1, further comprising the step of:

(c) dissolving said flow of purified hydrogen fluoride vapor in high-purity water to form an aqueous hydrogen fluoride.

3. The method according to claim 2, further comprising the step of:

(d) directing said aqueous hydrogen fluoride to a workstation in a production line for the manufacture of an electronic component.

4. The method according to claim 1, further comprising the step of:

(c) directing said flow of purified hydrogen fluoride vapor to a workstation in a production line for the manufacture of an electronic component.

5. The method according to claim 1, wherein said flow of hydrogen fluoride vapor of step (a) comprises less than 1 ppb arsenic.

6. A method for purifying hydrogen fluoride, for use in the manufacture of an electronic component, comprising the steps of:

(a) providing an aqueous hydrogen fluoride comprising a low concentration of arsenic;

(b) introducing said aqueous hydrogen fluoride comprising a low concentration of arsenic into a fractionating column, wherein a first flow of purified hydrogen fluoride vapor flows therefrom; and (c) introducing said first flow of purified hydrogen fluoride vapor into an ionic purifier which provides a recirculating volume of high-purity water containing a high concentration of hydrogen fluoride, wherein said recirculating volume of high-purity water is in contact with said first flow of purified hydrogen fluoride vapor, and wherein a second flow of purified hydrogen fluoride vapor flows from said ionic purifier.

7. The method according to claim 6, further comprising the step of:

(d) dissolving said second flow of purified hydrogen fluoride vapor in high-purity water to form a purified aqueous hydrogen fluoride.

8. The method according to claim 7, further comprising the step of:

(e) directing said aqueous hydrogen fluoride to a workstation in a production line for the manufacture of an electronic component.

9. The method according to claim 6, further comprising the step of:

(d) directing said second flow of purified hydrogen fluoride vapor to a workstation in a production line for the manufacture of an electronic component.

10. The method according to claim 6, wherein a high-surface area material is disposed inside said fractionating column.

11. The method according to claim 6, wherein said aqueous hydrogen fluoride of step (a) comprises less than 1 ppb of arsenic.

* * * * *